US005104023A

United States Patent [19]

Nishiguchi et al.

[11] Patent Number: 5,104,023

[45] Date of Patent: Apr. 14, 1992

[54] APPARATUS FOR FABRICATION SEMICONDUCTOR DEVICE

[75] Inventors: Masanori Nishiguchi; Takeshi Sekiguchi; Nobuyoshi Tato, all of Kanagawa, Japan

[73] Assignee: Sumitomo Electric Industries, Ltd., Osaka, Japan

[21] Appl. No.: 681,670

[22] Filed: Apr. 8, 1991

Related U.S. Application Data

[63] Continuation of Ser. No. 433,428, Nov. 8, 1989, abandoned, which is a continuation of Ser. No. 178,371, Apr. 6, 1988, abandoned.

[30] Foreign Application Priority Data

May 1, 1987 [JP] Japan ................................ 62-108117
May 1, 1987 [JP] Japan ................................ 62-108118
May 1, 1987 [JP] Japan ................................ 62-108119

[51] Int. Cl.[5] .................... B28D 5/00; H01L 21/304 B

[52] U.S. Cl. .................................... 225/103; 225/96.5; 225/93.5; 225/105

[58] Field of Search ................. 225/2, 96.5, 103, 93.5, 225/105

[56] References Cited

U.S. PATENT DOCUMENTS 3,493,155 2/1970 Litant et al. ............................ 225/2
3,507,426 4/1970 Bielen et al. ............................ 225/2
3,562,057 2/1971 McAlister et al. ....................... 225/2
3,727,282 4/1973 Neary ................................ 225/96.5
3,743,148 7/1973 Carlson .............................. 225/96.5
3,790,051 2/1974 Moore ................................ 225/96.5
3,918,150 11/1975 Gantley .................................. 225/2
4,247,031 1/1981 Pote et al. ............................. 225/2
4,410,168 10/1983 Gotman ................................ 269/21

FOREIGN PATENT DOCUMENTS 0080765 11/1982 European Pat. Off. .
1908597 2/1969 Fed. Rep. of Germany .
1481711 6/1966 France .

*Primary Examiner*—Hien H. Phan
*Attorney, Agent, or Firm*—Cushman, Darby & Cushman

[57] ABSTRACT

An apparatus for making a semiconductor device comprises a flexible mat, support shafts for supporting the flexible mat in a substantially horizontal position, a pressing plate having a generally convex body and supported for movement up and down, and a drive mechanism for driving one of the pressing plate and the wafer relative to the other of the pressing plate and the wafer so as to move up and down. The wafer having the first and second surfaces opposite to each other with the chips formed on the first surface thereof is placed on the mat with the chips confronting the flexible mat. The convex body of the pressing plate is pressed against the second surface of the wafer to separate the chips on the wafer individually.

4 Claims, 3 Drawing Sheets

APPARATUS FOR FABRICATION SEMICONDUCTOR DEVICE

This is a continuation of application Ser. No. 433,428, filed on Nov. 8, 1989, which is now abandoned, which was a FWC of abandonded application Ser. No. 178,371, filed Apr. 6, 1988.

BACKGROUND OF THE INVENTION

1. Field of the Invention

The present invention generally relates to an apparatus for fabricating a semiconductor device and, more particularly, to an apparatus for individually separating semiconductor chips formed on a semiconductor wafer.

2. Description of the Prior Art

A technique for individually separating a plurality of chips formed on a single wafer is called "dicing". As a separating method, there are two systems; a scribing system in which the wafer is scribed along the chips to form scribed grooves with the use of a laser or a diamond needle and the chips are subsequently mechanically separated, and a dicing saw system in which the high speed rotation of a thin diamond blade is used to cut deep so that the chips can be mechanically separated or to render the chips to be separable during the cutting.

The wafer half-cut by use of either the scribing technique or the dicing technique is divided into the individual chips by a mechanical means. FIG. 5 illustrates a schematic construction of one prior art apparatus for dividing the wafer.

The apparatus shown in FIG. 5 comprises a base 1 having a rubber mat 2 placed thereabove. A half-cut wafer 3 having first and second surfaces opposite to each other and having chips formed on the first surface thereof is placed on the rubber mat 2 with the first and second surfaces thereof confronting the rubber mat 2 and upwardly, respectively. Prior to the placement of the wafer 3 on the rubber mat, an adhesive tape 5 is applied to the second surface of the wafer so that, when the wafer 3 is divided or separated, the chips will not scatter and can be retained in position.

While a peripheral surface of a generally cylindrical rod-like roller 14 is pressed against the second surface of the wafer 3, the roller 14 is driven to rotate about the longitudinal axis thereof to separate the wafer 3. The chips divided from the wafer are separated on the tape 5 and are suitably cut according to the need for actual use.

As hereinabove discussed, the prior art apparatus for dividing the chips formed on the generally circular wafer is so designed that the wafer supported by the rubber mat having high elasticity placed on the base is divided while the cylindrical rod-like roller is pressed thereagainst. Both of the wafer and the rubber mat when pressed by the cylindrical rod-like roller are downwardly loaded to deform. Because of this, the wafer can be cut only in one direction and, in order for the wafer which has been scribed to be cut in both X-axis and Y-axis directions, the process must to be repeated two times.

Moreover, while a pressing surface exhibited by the rotation of the cylindrical rod-like roller is flat, a peripheral area of the wafer may have a film such as SiN film left unremoved, rendering the peripheral area of the wafer thicker than the remainder thereof. Therefore, a greater pressing force acts on the peripheral area of the wafer than on a central area thereof.

Furthermore, according to the prior art apparatus, localized areas of the wafer tend to be excessively pressed to such an extent as to result in breakage of the wafer and/or damages to the wirings fabricated on the wafer. In order to avoid these problems, the adjustment of the pressing force is required, rendering the apparatus as a whole costly to manufacture. In addition, subsequent to the separation of the chips, the adhesive tape must be expanded to separate the chips individually, requiring increased manufacturing steps.

SUMMARY OF THE INVENTION

The present invention has been devised with a view to substantially eliminating the above described problems inherent in the prior art apparatus and has for its essential object to provide an improved apparatus for fabricating a semiconductor device which is effective to accurately separate the chips through a single process without excessive pressing force being applied.

In order to accomplish the above described object of the present invention, an apparatus for making a semiconductor device herein disclosed according to a first preferred embodiment of the present invention comprises a flexible mat, means for supporting the flexible mat in a substantially horizontal position, a pressing means having a generally convex body and supported for movement up and down, and a drive means for driving one of the pressing means and the wafer relative to the other of the pressing means and the wafer so as to move up and down. The wafer having the first and second surfaces opposite to each other with the chips formed on the first surface thereof is placed on the mat with the chips confronting the flexible mat. The convex body of the pressing means is pressed against the second surface of the wafer to separate the chips on the wafer individually.

Preferably, the flexible mat may be circular in shape as shown in FIG. 6 and may be made of rubber.

Preferably, the drive means may be adapted to drive the pressing means relative to the wafer.

Preferably, the pressing means may be constituted by at least three rods mounted upright on the support means and a pressing plate having the convex body and supported by the three upright rods. The convex body may have a surface area substantially larger than the wafer.

According to the first preferred embodiment of the present invention, the wafer placed on the flexible mat with the first surface thereof confronting the flexible mat is pressed under a predetermined pressure by the pressing means with the convex body contacting the second surface of the wafer. The wafer so pressed deforms to a shape conforming to, and so as to follow, the shape of the convex body of the pressing means whereby cracking of the wafer is initiated from a center thereof, and no higher pressure than the predetermined pressure act on that portion of the wafer where the cracking has taken place.

Accordingly, even where the wafer has the peripheral area having a thickness greater than that of the remainder thereof because of the presence of the film such as SiN film, the cracking of the wafer takes place from the central area thereof with no substantial possibility of the higher pressure acting on the peripheral area of the wafer than that on the central area thereof. Therefore, the chips on the wafer which has been half-cut can be progressively separated from the central area of the wafer in a direction radially outwardly thereof while the predetermined pressure acts uniformly thereon.

In view of the foregoing, the wafer can be accurately divided into the plurality of chips without damaging the chips and in one process. If the flexible mat is circular in shape, and since the wafer pressed by the pressing means is also circular in shape, both of the mat and the wafer can deform simultaneously with each other so as to follow the curvature of the convex body of the pressing means when the pressing means is applied thereto, and therefore, the pressing force so applied to the wafer is uniform over the whole chips enough to avoid any possible damage to the chips which would occur when the chips are separated.

In another preferred embodiment of the present invention, the apparatus may further comprises means for supporting a tape, having the wafer placed thereon, beneath the mat under tension, and a heating means for heating the convex body of the pressing means.

According to this second preferred embodiment of the present invention, the pressing means may comprise a wafer ring surrounding the convex body and supported for movement up and down, and a ring drive means for driving the wafer ring up and down. Furthermore, the convex body of the pressing means is preferably heated to about 60° C.

With the apparatus according to the second preferred embodiment of the present invention, while it operates in a manner substantially similar to that according to the first preferred embodiment, the convex body heated to a predetermined temperature is pressed against the second surface of the wafer through the tape to separate the chips and, at the same time, the tape is caused to expand to allow the complete separation of the chips. The heating of the convex body is advantageous in that the tape is allowed to expand readily to facilitate a ready separation of the chips from the wafer, or a ready breakage of the wafer into the chips.

The use of the tape support means is particularly advantageous in the following respect. When the convex body of the pressing means heated to the predetermined temperature is brought into contact with the tape, the tape is heated to increase the elongation while supported under tension by the tape support means. Therefore, when the pressing means is subsequently pressed against the second surface of the wafer to separate the chips individually, the chips so separated are caused to adhere to the tape. The subsequent separation of the pressing means away from the wafer is accompanied by a corresponding movement of the wafer ring so that a tape held taut on the wafer ring can be automatically fitted to the second surface of the wafer thereby to retain the separated chips. In this way, the application of the tape, the separation of the wafer and the expansion of the tape are all performed automatically in the apparatus according to the present invention.

In any event, in the practice of the present invention, the pressing means maybe positioned either above or beneath the wafer supported by the mat. Where the pressing means is positioned beneath the wafer, the pressing means may be held still while the wafer can be driven by the drive means in a direction close toward or away from the pressing means. Alternatively, where the pressing means is positioned beneath the wafer, the wafer may be held still while the pressing means can be driven by the drive means in a direction toward and away from the wafer.

BRIEF DESCRIPTION OF THE DRAWINGS

This and other objects and features of the present invention will become clear from the following description taken in conjunction with preferred embodiments thereof with reference to the accompanying drawings, in which.

DETAILED DESCRIPTION OF THE EMBODIMENTS

Figure 1:
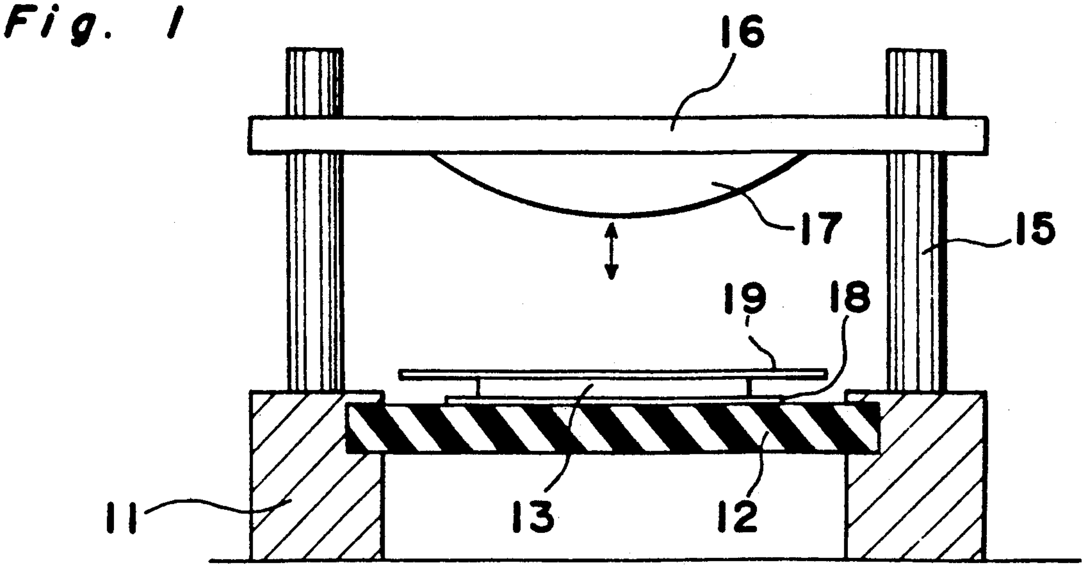
FIG. 1 is a schematic side view of an apparatus for fabricating a semiconductor device according to a first preferred embodiment of the present invention.

Before the description of the present invention proceeds, it is to be noted that like parts are designated by like reference numerals.

Figure 7:
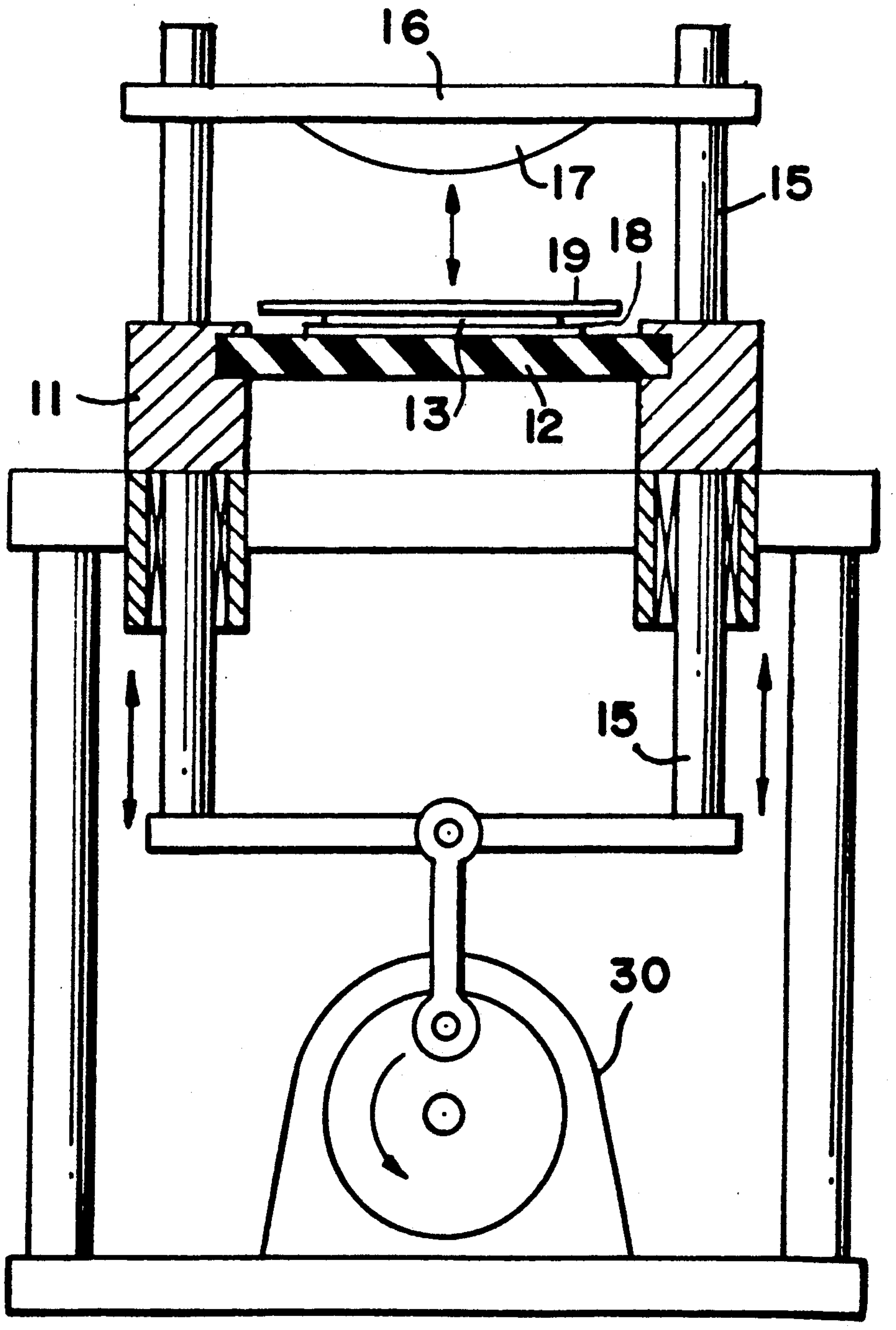
FIG. 7 is a side view of the first embodiment of the present invention illustrating the drive means.

Referring first to FIG. 1, an apparatus for making a semiconductor device according to the embodiment shown therein comprises a generally ring-shaped base 11 having a generally circular rubber mat 12 mounted thereon so as to close the opening of the ring-shaped base 11. At least three, preferably four, upright posts 15 are rigidly mounted on the base 11 so as to extend upwardly therefrom and spaced an equal distance in a direction circumferentially of the base 11. The upright posts 15 carries a generally circular pressing plate 16 mounted thereon so as to lie horizontal, i.e., in a plane perpendicular to any one of the upright posts 15, and so as to move in a direction toward and away from the rubber mat 12 along the upright posts 15. The pressing plate 16 has one surface formed with a generally hemispherical body 17 protruding downwardly towards the rubber mat 12. A drive mechanism used to move the pressing plate 16 in a direction close towards and away from the rubber mat 12 along the upright posts 15 is illustrated in FIG. 7 at 30, or may be of any known construction.

When the apparatus of the construction described above with reference to FIG. 1 is to be operated, a wafer 13 having first and second surfaces opposite to each other with chips formed on the first surface thereof is placed on the rubber mat 12 through a surface protective tape 18 laid between the rubber mat 12 and the wafer 13. During this placement, care must be taken that the wafer 13 should be placed on the rubber mat 12 with the chips on the first surface thereof held in contact with the protective tape 18 and with the second surface confronting upwards. The second surface of the wafer 13 has a tape 19 applied thereto and, hence, when the wafer 13 is placed on the rubber mat 12 in the manner as hereinabove described, the tape 19 on the second surface of the wafer 12 confronts upwards and in a direction opposite to the rubber mat 12.

Figure 2A:
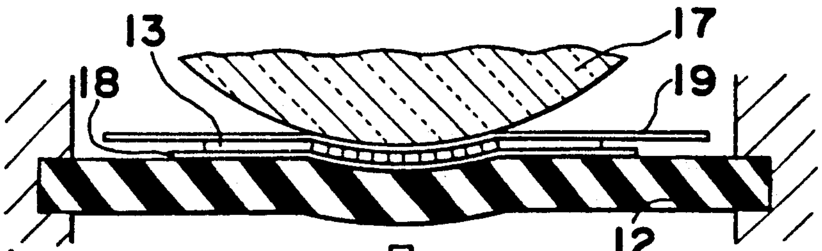
FIGS. 2(*a*) and 2(*b*) are fragmentary sectional views showing how a wafer deforms when pressed by a pressing means.
Figure 2B:
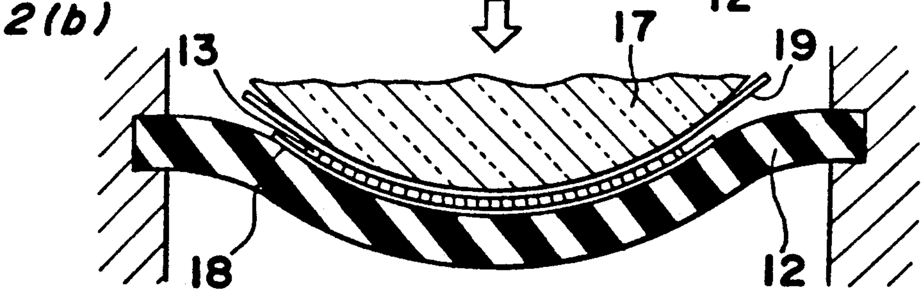
Figure 5:
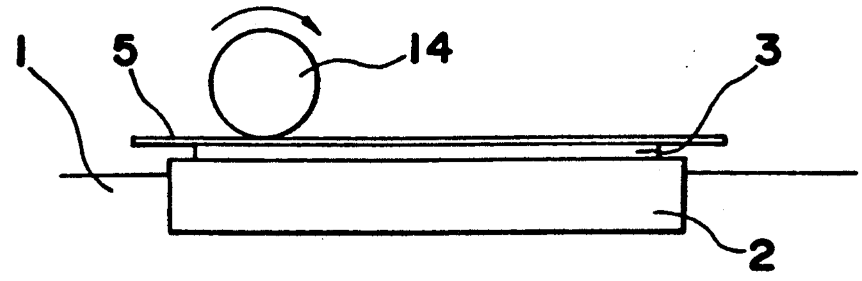
Fig. 5 Prior Art
FIG. 5 is a schematic side view of the prior art apparatus, reference to which has been made.

After the placement of the wafer 13, the drive mechanism is operated to move the pressing plate 16 downwards in a direction toward the wafer 13 on the rubber mat 12 along the upright posts 15. Upon the downward movement of the pressing plate 16, the generally hemispherical body 17 on the pressing plate 16 is brought into contact with the wafer 13 through the tape 19 substantially as shown in FIG. 2(*a*). After the generally hemispherical body 17 has been brought into contact with the wafer 13 while the pressing plate 16 is being further moved downwards, the wafer 13 together with the rubber mat 12 is downwardly deformed, i.e., concaved, by the application of a pressing force thereto from the hemispherical body 17, representing a rounded recess which follows the curvature of the hemispherical body 17 as shown in FIG. 2(*b*). As the wafer 13 is so deformed together with the rubber mat 12, cracking is initiated in the wafer 13 from a central area thereof and extends towards the periphery of the wafer 13, however, the pressing force applied from the hemispherical body 17 to the wafer does not act on the wafer once the cracking takes place to separate the chips individually.

Accordingly, even though the wafer has a greater thickness at a peripheral area thereof than that at the central area thereof because of the presence of a film such as SiN film, the chips formed on the wafer 13 receive a uniform pressing force transmitted from the hemispherical body 17. The application of the pressing force uniformly over the chips on the wafer 13 results not only in the minimization of any possible damage to the chips, but also in the separation of the chips in both of x-axis and y-axis directions perpendicular to each other.

Figure 3:
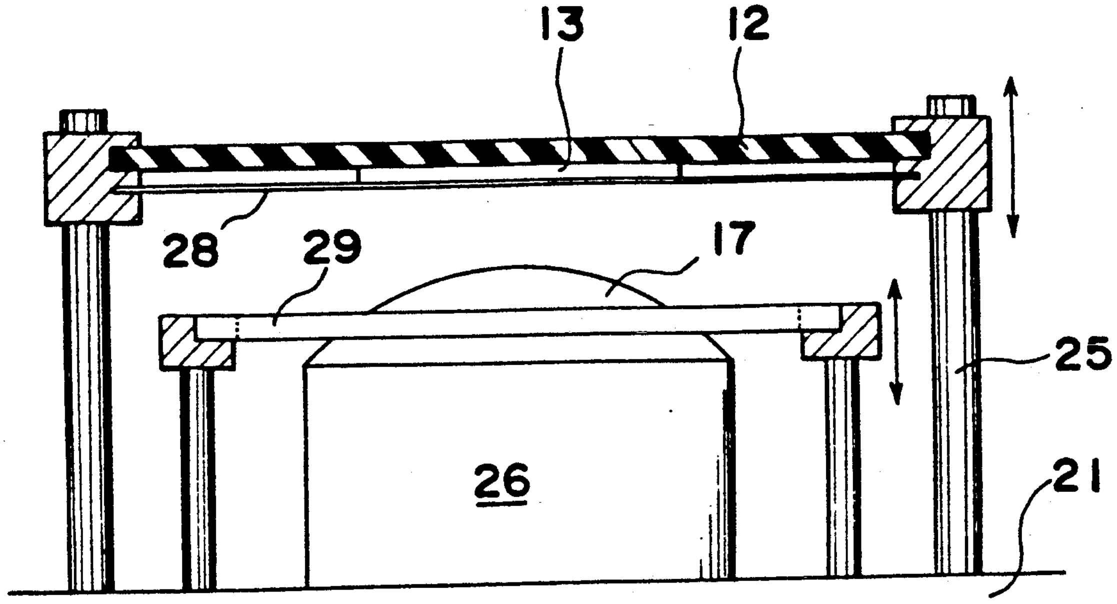
FIGS. 3 and 4 are schematic side views of the apparatus according to second and third embodiments of the present invention.

In a second preferred embodiment shown in FIG. 3, the apparatus comprises a base 21 having at least three, preferably four, upright posts 25 secured thereto so as to extend upwards, and a generally circular rubber mat 12 mounted thereon through a generally ring-shaped member for movement in a direction toward and away from the base 21 along the upright posts 25, said rubber mat 12 lying horizontal, i.e., in a plane perpendicular to any one of the upright posts 25. The ring-shaped member supporting the rubber mat 12 also supports a tape 28 on which the wafer 13 is placed, said tape 28 being positioned immediately beneath the rubber mat 12.

The apparatus also comprises a pressing block 26 rigidly mounted on the base 21 and having a generally hemispherical body 17 integrally formed therewith and protruding upwardly so as to confront the wafer 13, and a wafer ring 29 surrounding the hemispherical body 17 and supported on a plurality of support posts for movement up and down in a direction parallel to any one of the support posts. The hemispherical body 17 is of a type having a heater 50 embedded therein for heating the hemispherical body 17 to a predetermined temperature, for example, about 60° C.

When the apparatus according to the second preferred embodiment is to be operated, the wafer 13 is placed on the tape 18 with the chips on the first surface thereof confronting the rubber mat 12. Thereafter, the drive mechanism (not shown) is operated to move the wafer 13 together with the rubber mat 13 and the tape 28 downwardly in a direction close towards the hemispherical body 17, thereby bringing the wafer 13 into contact with the hemispherical body 17 while the wafer 13 is permitted to deform together with the rubber mat 13 to represent a rounded recess which follows the curvature of the hemispherical body 17. It is to be noted that shortly before the wafer 13 is deformed in contact with the hemispherical body 17, the latter is brought into contact with the tape 28 and, therefore, the tape 28 is heated in contact with the hemispherical body 17. When the tape 28 is so heated, the ductility of the tape 28 is enhanced.

As the wafer 13 is so deformed together with the rubber mat 12, cracking is initiated in the wafer 13 from a central area thereof and extends towards the periphery of the wafer 13, however, the pressing force applied from the hemispherical body 17 to the wafer does no longer act on the wafer once the cracking takes place to separate the chips individually.

After the cracking occurring in the wafer 13, the rubber mat 12 is, together with the wafer 13, further moved a predetermined distance downwards to allow the tape 28 to elongate or expand while separating the chips individually. Thereafter, the wafer ring 29 is upwardly shifted by a suitable drive mechanism (not shown) along the support posts to apply a tape 28, which has previously been expanded thereover, to the wafer 13 from below.

Thus, from the foregoing description, it is clear that, with the apparatus according to the second preferred embodiment of the present invention, not only can the chips on the wafer be separated individually, but the application of the tape to the wafer can also be accomplished, thereby minimizing the number of steps required to manufacture the semiconductor device.

Figure 4:
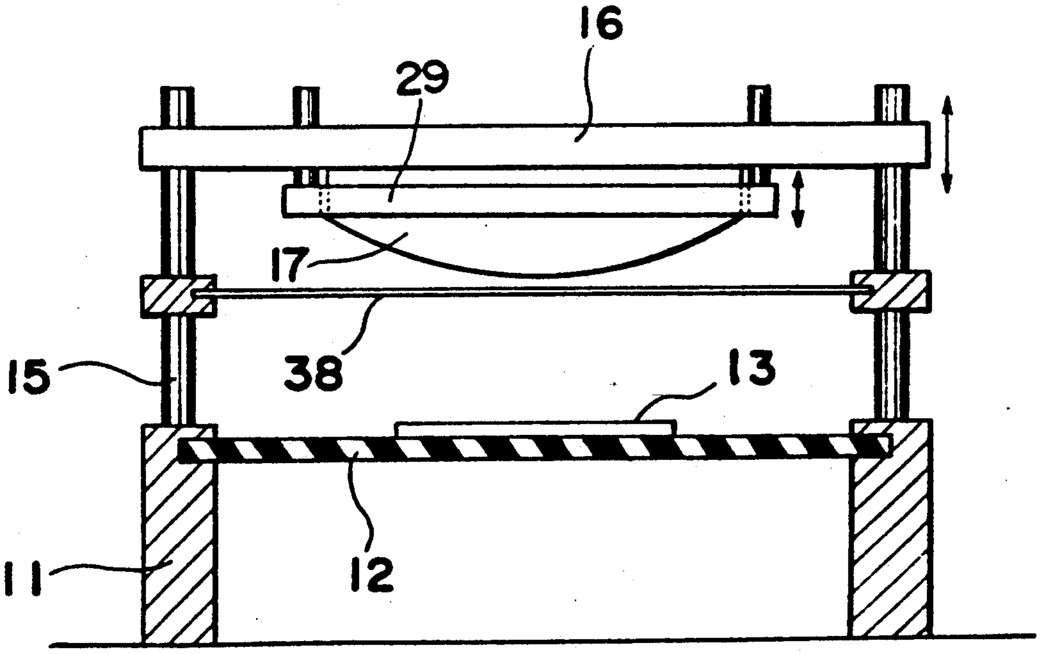
Figure 6:
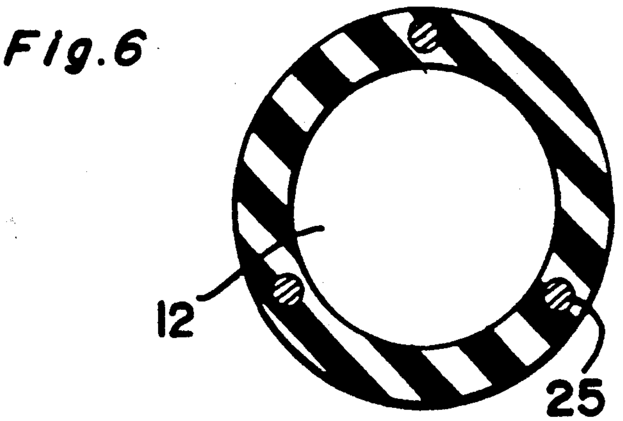
FIG. 6 is a top view of the apparatus of the present invention depicting a circular mat.

Referring now to FIG. 4, the apparatus shown therein is generally similar to that shown in and described with reference to FIG. 1. However, the apparatus shown in FIG. 4 may be considered a version of the apparatus of FIG. 1 in which a wafer ring 29 corresponding in function to the wafer ring 29 shown in and described with reference to FIG. 3 is provided for automatically applying a tape to the wafer 13. For this purpose, the apparatus shown in FIG. 4 is provided not only with the wafer ring 29, but also with a support ring slidably mounted on the upright posts 15 for movement up and down along the upright posts 15, said support ring having a tape 38 stretched thereon so as to lie immediately below the hemispherical body 17. The wafer ring 29 used in the apparatus of FIG. 4 has a plurality of slide rods extending upwardly from the wafer ring 29 and extending slidably through the presser plate for movement up and down independently of the movement of the presser plate 16, said slide rods being in turn drivingly coupled with a ring drive mechanism (not shown).

More specifically, the apparatus shown in FIG. 4 is so designed as to operate in the following manner.

The wafer 13 having the chips on the first surface thereof is placed on the rubber mat 12 with the chips on held in contact with the rubber mat 12. After the placement of the wafer 13, the drive mechanism is operated to move the pressing plate 16 downwards in a direction close towards the wafer 13 on the rubber mat 12 along the upright posts 15.

During the downward movement of the pressing plate 16, the hemispherical body 17 then heated to about 60° is brought into contact with the tape 38 to enhance the ductility of the tape 38. The pressing plate 16 is then further moved downwards until the hemispherical body 17 is brought into contact with the wafer 13 on the rubber mat 12. After the hemispherical body 17 has been brought into contact with the wafer 13 while the pressing plate 16 is being further moved downwards, the wafer 13 together with the rubber mat 12 is downwardly deformed, i.e., concaved, by the application of a pressing force thereto from the hemispherical body 17, representing a rounded recess which follows the curvature of the hemispherical body 17. As the wafer 13 is so deformed together with the rubber mat 12, cracking is initiated in the wafer 13 from a central area thereof and extends towards the periphery of the wafer 13, however, the pressing force applied from the hemispherical body 17 to the wafer does no longer act on the wafer once the cracking takes place to separate the chips individually.

After the cracking occurring in the wafer 13, the wafer ring 29 is lowered to retain the tape 38 pressed against the rubber mat 12. When the pressing plate 16 in the lowered position is then elevated to leave away from the rubber mat 12, the tape 28 then expanded by the wafer ring 29 is applied to the wafer 12. Thereafter, the wafer ring 29 is upwardly shifted in readiness for the removal of the separated chips then retained in position by the applied tape 38.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention unless they depart therefrom.

What is claimed is:

1. An apparatus for breaking and separating semiconductor chips formed on a semiconductor wafer, said wafer having first and second surfaces opposite to each other with chips formed by scribing on the first surface thereof comprising:

a flexible mat adapted for holding said wafer in its central region and contacting said wafer over substantially its entire area;

means for supporting the flexible mat in a substantially horizontal position;

means for supporting a tape horizontally under tension beneath the flexible mat, said tape adapted to have a wafer mounted thereon;

a pressing means having spherical convex surface;

a heating means for heating the spherical convex surface to a predetermined temperature; and a drive means for driving said mat supporting means and said tape supporting means relative to the pressing means, said spherical convex surface of the pressing means being pressed against the second surface of the wafer so as to initially contact a central region of said wafer with an apex of said convex surface thus initially applying a greater force to a central region of said wafer, said force propagating radially to more remote portions of said wafer as said driving means moves said mat supporting means and said tape supporting means relative to said pressing means to break the wafer and thus separate the chips on the wafer individually and said tape being, at the same time, expanded to completely separate the chips.

2. The apparatus as claimed in claim 1, wherein said flexible mat is circular in shape.

3. The apparatus as claimed in claim 1, wherein said flexible mat is made of rubber.

4. The apparatus as claimed in claim 1 wherein the predetermined temperature is about 60° C.

* * * * *